United States Patent
Felser et al.

(10) Patent No.: US 8,654,807 B2
(45) Date of Patent: Feb. 18, 2014

(54) ELECTRICAL DEVICES FORMED USING TERNARY SEMICONDUCTING COMPOUNDS

(75) Inventors: Claudia Felser, Dresden (DE);
Shoucheng Zhang, Stanford, CA (US);
Xiao Zhang, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 125 days.

(21) Appl. No.: 13/299,326

(22) Filed: Nov. 17, 2011

(65) Prior Publication Data

US 2012/0128017 A1    May 24, 2012

Related U.S. Application Data

(60) Provisional application No. 61/415,266, filed on Nov. 18, 2010.

(51) Int. Cl.
*H01S 5/00* (2006.01)
*H01L 25/00* (2006.01)

(52) U.S. Cl.
USPC ....................... 372/44.01; 136/243

(58) Field of Classification Search
USPC ............. 372/44.01; 136/243, 252; 257/13, 14
See application file for complete search history.

(56) References Cited

U.S. PATENT DOCUMENTS

| | | | |
|---|---|---|---|
| 5,309,472 A | 5/1994 | Kudo et al. | |
| 2001/0034982 A1 | 11/2001 | Nagao et al. | |
| 2009/0152495 A1 | 6/2009 | Naum et al. | |
| 2010/0065791 A1 | 3/2010 | Clothier et al. | |
| 2010/0083999 A1* | 4/2010 | Hovel | 136/244 |
| 2010/0170563 A1* | 7/2010 | Xue | 136/255 |
| 2010/0187541 A1 | 7/2010 | Slack et al. | |

OTHER PUBLICATIONS

Aron Walsh et al., "Theoretical study of stability and electronic structure of Li(Mg,Zn)N alloys: A candidate for solid state lighting," The American Physical Society, Physical Review B 76, 195208 (2007), pp. 1-8.

* cited by examiner

*Primary Examiner* — Armando Rodriguez
(74) *Attorney, Agent, or Firm* — Patent Law Group LLP; Brian D Ogonowsky

(57) ABSTRACT

An electrical device includes a charge carrier transport layer formed using a ternary semiconducting compound having a stoichiometry of 1:1:1 and an element combination selected from the set of I-II-V, I-III-IV, II-II-IV, and I-I-VI; or having a stoichiometry of 3:1:2 and an element combination selected from the set of I-III-V; or having a stoichiometry of 2:1:1 and an element combination selected from the set of I-II-IV. In some embodiments, the charge carrier transport layer is used as the radiation absorption layer for a photovoltaic cell, or a light emitting layer of a light emitting device. Other devices, such as laser diode, a photodetection device, an optical modulator, a transparent electrode and a window layer, can also be formed using the ternary semiconducting compound as the charge carrier transport.

5 Claims, 1 Drawing Sheet

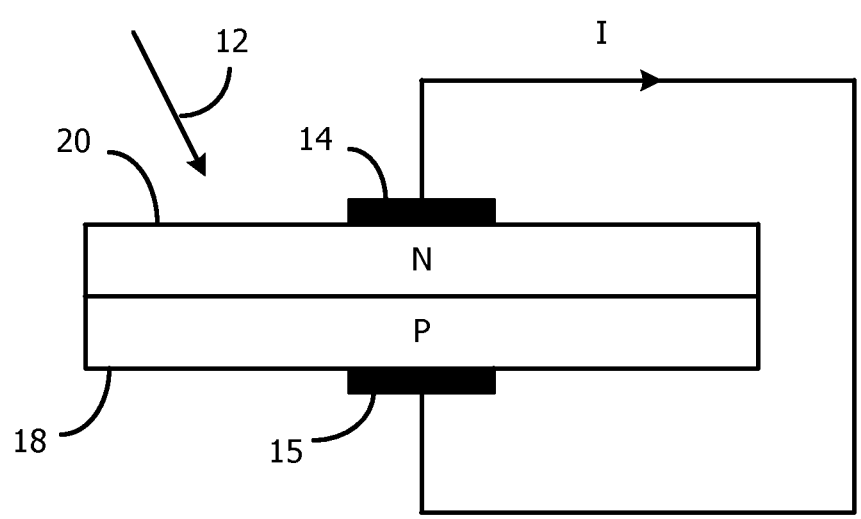

ELECTRICAL DEVICES FORMED USING TERNARY SEMICONDUCTING COMPOUNDS

CROSS-REFERENCE TO RELATED APPLICATIONS

This application claims the benefit of U.S. Provisional Patent Application Ser. No. 61/415,266, filed on Nov. 18, 2010, which application is incorporated herein by reference in its entirety.

FIELD OF THE INVENTION

The invention relates to electrical devices formed using ternary semiconducting compounds and, in particular, to electrical devices formed using ternary semiconducting compounds with compositions of 1:1:1, or 3:1:2, or 2:1:1, with a deviation from the stoichiometry of less than 5%.

DESCRIPTION OF THE RELATED ART

US Patent Publication No. 20100065791, to Clothier et al., describes semiconductor compounds with anti-fluorite-type materials suitable for power generation and radiation absorption and detection, especially as applied to radioisotope identification. The materials described by Clothier include a composition of stoichiometry of $LiM^{2+}G^{V}$ whose atomic constituents exhibit an antifluorite-type ordering. Examples of compounds include LiMgN, LiMgP, LiMgAs, LiZnN, LiZnP, LiCdP, LiCdAs, etc. Clothier suggests that compositions of compounds whose band gaps and carrier properties are optimal for the photon energy range can be useful in energy conversion applications, including light emitting diodes, and photovoltaic cells.

Aron Walsh, et al. describe in a paper "Theoretical study of stability and electronic structure of Li(Mg, Zn)N alloys: A candidate for solid state lighting," Physical Review B vol. 76, pp. 195208-1 to 195208-8 (2007), the use of tetrahedral semiconductors (I-II-V compounds) for green emission gap of LED devices. More specifically, LiMgN and LiZnN compounds are evaluated for green light emission. Walsh also describes an alloy system with band gap tunable throughout the visible range, such as by studying the ordering of compositions, e.g. $LiMg_{0.5}Zn_{0.5}N$.

US Patent Publication No. 20090152495, to Naum et al., describes a high-brightness yellow-orange yellow phosphor for use in warm white LED that contains the substances of $Li^{+1}$, $Mg^{+2}$ and $N^{-3}$. The high-brightness yellow-orange yellow phosphor radiates in a visible orange yellow band at $\lambda=538\sim569$ nm when activated by a shortwave light from an InGaN semiconductor heterostructure.

FIG. 1 is a cross-sectional view of a photovoltaic cell formed with p and n-type ternary semiconducing compounds in accordance with one embodiment of the invention.

SUMMARY OF THE INVENTION

According to one embodiment of the present invention, an electrical device includes a charge carrier transport layer formed using a ternary semiconducting compound having a stoichiometry of 1:1:1 and an element combination selected from the set of I-II-V, II-II-IV, and I-I-VI; or having a stoichiometry of 3:1:2 and an element combination selected from the set of I-III-V; or having a stoichiometry of 2:1:1 and an element combination selected from the set of I-II-IV.

In embodiments of the present invention, the charge carrier transport layer is used to form the radiation absorption layer of a photovoltaic cell, the light emitting layer of a light emitting device, the gain medium of a laser diode, the light absorbing layer of the photodetection device, a transparent electrode or a window layer.

The present invention is better understood upon consideration of the detailed description below and the accompanying drawings.

DETAILED DESCRIPTION OF THE PREFERRED EMBODIMENTS

In accordance with the principles of the present invention, electrical devices are formed using a ternary semiconducting compound as a charge carrier transport layer. In particular, the ternary semiconducting compounds, formed using selected materials as described below, have band gaps that are suitable in applications where III-V elements have been used. Electrical devices that can be formed using the ternary semiconducting compounds of the present invention include photovoltaic cells, light emitting devices, laser diode devices, light detecting devices, optical modulator devices, transparent electrodes and window layers.

The ternary semiconducting compounds of the present invention provides advantages over conventional III-V semiconductor materials in that the ternary semiconducting compounds are made from materials that are abundant in nature, resulting in lower material cost. The ternary semiconducting compounds of the present invention may also be easier to manufacture due to their crystal structures as compared to other materials of similar band gap. For instance, the ternary semiconducting compounds of the present invention may be formed on various substrates, such as low cost silicon substrates, with a small lattice mismatch and does not require the use of more costly substrates. The ternary semiconducting compounds of the present invention can also be easier to dope.

In the present description, a "ternary semiconducting compound" refers to a semiconducting compound containing three different elements. The ternary semiconducting compounds of the present invention are made from selected elements with selected stoichiometry to realize the desired band gap and electrical properties. Also, in the present description, the term "group I elements" refers to groups IA and IB elements in the traditional numbering system and group 1 and 11 in the current numbering system recommended by the IUPAC (the International Union of Pure and Applied Chemistry). Similarly, the term "group II elements" refers to groups IIA and IIB elements in the traditional numbering system and group 2 and 12 in the current IUPAC numbering system. Elements in group 1 and 11 have similar bonding and therefore are collectively referred to as "group I elements." Elements in group 2 and 12 have similar bonding and therefore are collectively referred to as "group II elements."

Furthermore, in the present description, the term "group III elements" refers to group IIIA elements in traditional numbering system and group 13 in the current IUPAC numbering system. The term "group IV elements" refers to group IVA elements in traditional numbering system and group 14 in the current IUPAC numbering system. The term "group V elements" refers to group VA elements in traditional numbering system and group 15 in the current IUPAC numbering system. Finally, the term "group VI elements" refers to group VIA elements in traditional numbering system and group 16 in the current IUPAC numbering system.

Ternary Semiconducting Compounds

According to embodiments of the present invention, the ternary semiconducting compounds of the present invention include three groups of materials formed using the materials and stoichiometry described below.

A first group of ternary semiconducting compounds has a composition of 1:1:1 and element combinations selected from combinations of groups of elements as follows:
  i. an element combination of groups I, II and V (I-II-V);
  ii. an element combination of groups I, III and IV (I-III-IV);
  iii. an element combination of groups II, II, IV (II-II-IV); and
  iv. an element combination of groups I, I, VI (I-I-VI).

The first group of ternary semiconducting compounds can have a deviation from the 1:1:1 stoichiometry of less than 5% (i.e., 1±0.05:1±0.05:1±0.05). As discussed above, "group I" elements above refer to elements in groups IA and IB or groups 1 and 11 of the periodic table and "group II" elements above refer to elements in group IIA and IIB or groups 2 and 12 of the periodic table. Groups III, IV, V and VI elements refer to elements in groups IIIA, IVA, VA and VIA, respectively, or groups 13, 14, 15 and 16, respectively, of the periodic table.

A second group of ternary semiconducting compounds has a composition of 3:1:2 and element combinations of groups I, III and V (I-III-V). The second group of ternary semiconducting compounds can have a deviation from the 3:1:2 stoichiometry of less than 5% (i.e., 3±0.05:1±0.05:2±0.05). As discussed above, "group I" elements above refer to elements in groups IA and IB or groups 1 and 11 of the periodic table. Groups III and V elements refer to elements in groups IIIA and VA, respectively, or groups 13 and 15, respectively, of the periodic table.

A third group of ternary semiconducting compounds has a composition of 2:1:1 and element combinations of groups I, II and IV (I-II-IV). The third group of ternary semiconducting compounds can have a deviation from the 2:1:1 stoichiometry of less than 5% (i.e., 2±0.05:1±0.05:1±0.05). As discussed above, "group I" elements above refer to elements in groups IA and IB or groups 1 and 11 of the periodic table and "group II" elements above refer to elements in group IIA and IIB or groups 2 and 12 of the periodic table. Group IV elements refer to elements in groups IVA or group 14 of the periodic table.

The table below summarizes the element combinations and stoichiometry of the ternary semiconducting compounds of the present invention:

| Stoichiometry | Element Combination |
|---|---|
| 1:1:1 | I-II-V |
| 1:1:1 | I-III-IV |
| 1:1:1 | II-II-IV |
| 1:1:1 | I-I-VI |
| 3:1:2 | I-III-V |
| 2:1:1 | I-II-IV |

In some embodiments of the present invention, the following elements from each group are used to form the ternary semiconducting compounds:
  i. Group I—Li, Na, K and Cu;
  ii. Group II—Be, Ca, Mg and Zn;
  iii. Group III—B, Al, Ga and In;
  iv. Group IV—C, Si, Ge, Sn, and Pb;
  v. Group V—N, P, As, Sb, Bi; and
  v. Group VI—O, S, Se and Te.

Some exemplary ternary semiconductor compounds of the present invention include LiMgN (I-II-V) with a band gap of 3.2 eV, and $Li_3AlN_2$ (I-III-V) with a band gap of 4.4 eV.

According to another aspect of the present invention, the composition of the ternary semiconducting compounds can be tuned isoelectronicly to continuously adjust the band gap of the resulting compounds. The tunable band gap characteristics of the ternary semiconducting compounds of the present invention enable the electric devices formed therefrom to cover a wide range of applications, as will be described in more detail below.

In some embodiments, each element in the aforementioned ternary semiconducting compounds can be partially replaced by elements of the same isoelectronicity, in an one-by-one manner to maintain isoelectronicity. In some embodiments, a ternary semiconducting compound is tuned by partially replacing an element with another element in the compound having the same isoelectronicity so that the resulting compound remains a ternary semiconducting compound. In other elements, a ternary semiconducting compound is tuned by partially replacing an element with another element not in the compound but having the same isoelectronicity. Such element replacement results in compounds that are no longer ternary but contain more than three elements. By tuning the semiconducting compounds in this manner, the band structures and lattice constants can be continuously changed to adapt to different applications. In the present description, the term "tuned semiconducting compound" refers to a ternary semiconducting compound having it composition tuned isoelectronicly and may contain three or more elements.

In particular, elements in group I (groups 1 or 11), such as Li, Na, K, and Cu, have isoelectronicity of 1 and can be used to replace each other. Elements in group II (groups 2 or 12), such as Be, Ca, Mg and Zn, have isoelectronicity of 2 and can be used to replace each other. Elements in group III (group 13), such as B, Al, Ga and In, has isoelectronicity of 3 and can be used to replace each other. Elements in group IV, such as C, Si, and Ge, have isoelectronicity of 4 and can be used to replace each other. Elements in group V, such as N, P, As, Sb and Bi, have isoelectronicity of 5 and can be used to replace each other. Finally, elements in group VI, such as O, S, Se and Te, have isoelectronicity of 6 and can be used to replace each other. In one embodiment, a ternary semiconducting compound LiMgN (I-II-V) is tuned to a tuned semiconducting compound of $Li_{1-x}Na_xMg_{1-y}Zn_yN_{1-z}P_z$. In another embodiment, a ternary semiconducting compound LiNaTe (I-I-VI) is turned to a tuned semiconducting compound of $Li_{1+x}Na_{1-x}Te$.

The aforementioned ternary semiconducting compounds or tuned semiconducting compounds can be fabricated using conventional semiconductor fabrication processes including physical vapor deposition (PVD), chemical vapor deposition (CVD), and molecular beam epitaxy (MBE), and other deposition methods currently known or to be developed. The ternary semiconducting compounds or tuned semiconducting compounds can be fabricated on a variety of substrates, including silicon substrates.

Applications

A variety of electrical devices can be formed using the ternary semiconducting compounds described above as the charge carrier transport layer. The below description is illustrative of electrical devices in which the ternary semiconducting compounds can be used. The description below is not intended to be limiting. Other electrical devices can be formed using the ternary semiconducting compounds of the present invention to exploit the unique properties of these materials.

(1) Photovoltaic Cells (Photon Absorption)

According to embodiments of the present invention, a photovoltaic cell is formed using one or more ternary semiconducting compounds or one or more tuned semiconducting compounds described above as a radiation absorption layer or light absorbing layer. Alternately, the ternary semiconducting compounds may also be used to form the transparent conducting layer or the window layer of the photovoltaic cell.

As shown in FIG. 1, a photovoltaic cell 10 is an electrical device (e.g. a semiconductor device) that converts light 12 or other radiant energy, in the range from ultraviolet to infrared radiation, incident on its surface into electrical energy in the form of power/voltage/current. The photovoltaic cell has two electrodes 14 and 15 and is usually configured as a diode with a top electrode and a bottom electrode with opposite electrical polarities. In accordance with one embodiment of the present invention, a pn junction is formed at the junction of a p-type ternary semiconductor compound 18 and an n-type ternary semiconductor compound 20. The photovoltaic cell produces direct current I which flows through the electrodes. As used herein, the term "photovoltaic cell" is generic to cells which convert radiant energy into electrical energy.

Most photovoltaic cells are configured as a p-n junction device with one or more junctions. In embodiments of the present invention, the photovoltaic cell formed using the ternary semiconducting compounds of the present invention may be formed as a p-n junction device, a p-i-n or n-i-p junction device or a multi junction device. A multi junction device includes a sequence of p-n junctions electrically connected to one another, such as through tunnel junctions, for covering a larger photon energy spectrum. Furthermore, the photovoltaic cell can be formed using a homojunction structure or a heterojunction structure. A homojunction structure uses the same materials on both side of the p-n junction. A heterojunction structure uses different types of materials for the p-type and n-type layers.

Photovoltaic cells use light energy (photons) from a light source to generate electricity through photovoltaic effect. A photovoltaic cell is also referred to as a solar cell when the light source is the sun. The most commonly used solar cells are wafer-based crystalline silicon cells. Crystalline silicon cells include monocrystalline silicon wafer cells or polycrystalline silicon wafer cells. Other commonly used solar cells are thin film solar cells. Thin film solar cells are formed by depositing thin-films on a supporting substrate. The thin films can include amorphous silicon or cadmium telluride (CdTe) or copper indium gallium selenide (CIGS) or others.

In general, a photovoltaic cell is a p-n junction diode (or p-i-n junction diode) formed of a photovoltaic material capable of converting incident radiation into electrical energy. Incident light with energy greater than the band gap of the semiconducting material will be absorbed by the semiconducting material, resulting in electron-hole pair generation. When the p-n junction diode is connected to an external circuit through conductive electrodes, a current will flow through the external circuit. The current flow combined with the electric field established across the p-n junction realizes power generation at the photovoltaic cell.

A photovoltaic cell requires a light absorbing material within the cell structure to absorb photons and generate electrons via the photovoltaic effect. In accordance with embodiments of the present invention, the ternary semiconducting compounds described above are used to form the light absorbing material of the photovoltaic cell. The ternary semiconducting compounds can be used to form homojunction devices or heterojunction devices.

In some embodiments, a photovoltaic cell, or more specifically a solar cell, is formed using ternary semiconducting compounds having a band gap that realize optimal efficiency for the solar light energy conversion. In particular, the optimal efficiency of a solar cell is obtained when the direct band gap of the materials is at a range of 0.8 eV to 2.0 eV. According to embodiments of the present invention, ternary semiconducting compounds having their direct band gap in the range of 0.8 eV to 2.0 eV are used to form the light absorbing materials of the solar cell. In some embodiments, the follow ternary semiconducting compounds from the elemental combination of I-II-V are used as the light absorbing materials for a solar cell:

i. NaZnAs having a band gap of 1.29 eV (direct band gap);
ii. CaCuN as a direct band gap material having a direct band gap of 1.02 ev and an indirect band gap of 1.82 eV;
iii. CaCuP as an indirect band gap material having an indirect band gap of 1.1 ev and a direct band gap of 2.37 eV;
iii. NaZnSb;
iv. CuZnP;
v. NaZnP having a band gap of 2.07 eV (direct band gap);
vi. NaZnN having a band gap of 0.82 eV (direct band gap);

Furthermore, in embodiments of the present invention, a photovoltaic cell is formed using the ternary semiconducting compounds for the p-type layer or the n-type layer of the p-n junction diode. In other embodiments, a photovoltaic cell is formed using the ternary semiconducting compound for the p-type layer, or the n-type layer, or the intrinsic layer of the p-i-n junction diode.

In some embodiments, each element in the aforementioned ternary semiconducting compounds can be partially replaced by elements of the same isoelectronicity, in an one-by-one manner to maintain isoelectronicity. The tuned semiconducting compound may contain three or more elements. By tuning the semiconducting compounds in this manner, the band structures and lattice constants can be continuously changed to adapt to different applications. For instance, in some embodiments, the compound $CaCuN_xP_{1-x}$ can be used as the light absorbing materials for a solar cell. The compound $CaCuN_xP_{1-x}$ has a direct band gap of 2.37 eV and an indirect band gap of 1.1 eV when x=0, and its direct band gap and indirect band gap becomes 1.02 eV and 1.82 eV when x=1. When x=0.614, the indirect and direct band gaps of this compound are equal at 1.54 eV. Thus the $CaCuN_xP_{1-x}$ combination has great tunability by using different value for x.

The ternary semiconducting compounds described above can be used to form single junction p-n junction diodes, double or multi junction p-n junction diodes. For instance, a double junction p-n junction diode can be formed using NaZnAs and NaZnP (band gap of 2.07 eV) or NaZnN (band gap of 0.82 eV) and NaZnP.

In embodiments of the present invention, the photovoltaic cell is formed using a quantum well structure. A quantum well is formed using a thin layer of semiconducting material. The thin layer, referred to as a "quantum layer", is sandwiched between two layers of dissimilar semiconductor materials having a wider band gap. The layers sandwiching the quantum layer are referred to as "barrier layers." As a result of the coupling, the band gap of the quantum layer is between the band gaps of the two surrounding barrier layers. A quantum well is formed in the quantum layer having a band gap that is wider than the semiconducting material in bulk thickness but narrower than those of the surrounding barrier layers.

A quantum well structure is formed with a minimum of a quantum layer and two surrounding barrier layers but is usually formed including a series of thin semiconductor layers with alternating barrier layers and quantum well layers. The quantum well layer has a thickness sufficiently thin to result in quantum mechanical effects. Typically, the thicknesses of the quantum well layers are in the range of 50 Å-500 Å. The barrier layers may be formed of about the same thickness. In a p-n junction diode or a p-i-n junction diode, the quantum well structure may be formed in the p-side of the diode, the n-side of the diode or the intrinsic region of the diode.

In embodiments of the present invention, a quantum well photovoltaic cell is formed using one or more ternary semiconducting compounds or one or more tuned semiconducting compounds described above as the quantum layer or as the barrier layer of the quantum well structure.

(2) Light Emitting Devices

According to embodiments of the present invention, the ternary semiconducting compounds of the present invention are used as the light emitting materials to form light emitting devices. In some embodiments, the light emitting devices thus formed can emit light from the infrared to ultraviolet spectrum range. In some embodiments, the light emitting devices are light emitting diodes (LEDs). The light emitting devices emit light when excess electrons and holes are pumped into conduction and valence bands of the light emitting materials formed by the ternary semiconducting compounds. The excess electrons and holes are then recombined around the band edge. The pumping can be carried out electrically or optically. For electrical pumping, the light emitting devices can be formed as a p-n diode, a p-i-n or n-i-p junction diode.

In one embodiment, a light emitting diode (LED) is formed using $Li_3AlN_2$ as the light emitting material. The LED is capable of generating light in the blue color range to the ultraviolet spectrum range. More specifically, in one embodiment, an LED is formed using a p-type $Li_3AlN_2$ layer formed on a substrate. A buffer layer may be used between the substrate and the p-type $Li_3AlN_2$ layer. An n-type $Li_3AlN_2$ layer or an n-type layer of a different semiconducting material is formed over the p-type $Li_3AlN_2$ layer to form the p-n junction. Electrical contacts are formed on the n-type $Li_3AlN_2$ layer, or the n-type layer of a different semiconducting material, and the substrate to complete the LED device.

More specifically, in embodiments of the present invention, an LED is formed using the ternary semiconducting compounds for the p-type layer or the n-type layer of the p-n junction diode. In other embodiments, an LED is formed using the ternary semiconducting compound for the p-type layer, or the n-type layer, or the intrinsic layer of the p-i-n or n-i-p junction diode In embodiments of the present invention, the light emitting devices incorporate quantum well structures to enhance the light emission efficiency. More specifically, an LED formed as p-n diode, p-i-n diode or n-i-p diode and quantum well structures may be formed in the p-side, the n-side or the intrinsic region of the diode. Each quantum well structure includes a quantum well layer with reduced band gap into which electrons and holes are injected from the adjacent barrier layer with higher band gap. The injected electrons and holes combine in the quantum well layers to produce light. The quantum well layer has a thickness (e.g., 50-500 Angstroms) that is sufficiently small such that electrons and holes display quantum mechanical effects.

In embodiments of the present invention, a quantum well light emitting device is formed using one or more ternary semiconducting compounds or one or more tuned semiconducting compounds described above as the quantum layer or as the barrier layer of the quantum well structure.

(3) Laser Diode

According to embodiments of the present invention, the ternary semiconducting compounds are used as the gain medium of a laser to form a laser diode. In a laser diode, the active region where the gain medium lies is confined between two confinement layers, forming a highly reflective optical cavity. The high refractive index of the two confinement layers results in total reflection of the generated light inside the cavity.

In some embodiments, a laser diode is formed using $Li_3AlN_2$ as the gain medium. The laser diode thus formed is capable of emitting blue light to ultraviolet light. More specifically, in one embodiment, a laser diode is formed using a p-type semiconducting layer formed on a substrate. A buffer layer may be used between the substrate and the p-type semiconducting layer. An intrinsic layer is formed between the p-type semiconducting layer and an n-type semiconducting layer. A current spreading layer, such as a transparent oxide layer, is formed on the n-type semiconducting layer. Electrical contacts formed on the current spreading layer, the substrate and cleaved facets sandwiching this laser diode complete the laser diode device. In one embodiment, the p-type semiconducting layer, the n-type semiconducting layer or the intrinsic layer of the laser diode may be formed using the ternary semiconducting compounds or the tuned semiconducting compounds. In one embodiment, the laser diode is formed using a p-type $Li_3AlN_2$ layer, or an n-type $Li_3AlN_2$ layer, or an intrinsic $Li_3AlN_2$ layer.

(4) Photodetection Device

According to embodiments of the present invention, the ternary semiconducting compounds of the present invention are used as the light absorbing layer of a photodetection device. The ternary semiconductor compounds can be used to detect photons with energy higher than the band gaps of the compounds. The photodetector devices can have various device structures, such as photoresistors, photovoltaic cells, photodiodes or phototransistors.

(5) Optical Modulator

According to embodiments of the present invention, the ternary semiconducting compounds of the present invention are used as the light absorbing materials to form optical modulators. An optical modulator is a device which is used to modulate a beam of light. The beam may be carried over free space, or propagated through an optical waveguide.

In some embodiments, the ternary semiconducting compounds of the present invention are used as the light absorbing materials to form absorptive modulators in which the absorption coefficient of the compounds are manipulated by Franz-Keldysh effect, Quantum-confined Stark effect, excitonic absorption or changes of free carrier concentration.

(6) Transparent Electrode/Window Layer

According to embodiments of the present invention, the ternary semiconducting compounds of the present invention are used transparent electrodes or window layers in electrical devices. The energy band gaps of the ternary semiconducting compounds serve as the low energy cut-off for photons to be absorbed. When most of the radiation spectrum are below the energy band gap of the compounds, the compounds are close to be transparent optically. That is, when the band gap is large enough to allow most of the visible spectrum to pass through, the compounds are optically transparent. When the compounds are doped to be highly conductive, the compounds can serve as transparent electrodes. In some embodiments, $Li_3AlN_2$ (band gap 4.4 eV) and $LiMgN$ (band gap 3.2 eV) are particularly suitable for this application.

In general, a photovoltaic cell is made up of a light absorption (power generation) layer, a window layer, and transparent electrodes. A light emitting device, laser diode or a display is made up of a light emitting layer, a cladding layer, a window layer, and transparent electrodes. In either a photovoltaic cell or an LED, a thin "window" layer is formed on the top which has the purpose of passing most of the light energy through and absorbing as little light energy as possible. The window layer must be thin enough and have a wide enough band gap to allow most of available light through.

By selecting ternary semiconducting compounds of the present invention having the desired band gap and band structure, the compounds can be used to form the window layer or transparent electrode in these electrical devices.

The above detailed descriptions are provided to illustrate specific embodiments of the present invention and are not intended to be limiting. One of ordinary skill in the art, upon being apprised of the present description, would appreciate that many other electrical devices can be formed using the ternary semiconducting compounds described above. Numerous modifications and variations within the scope of the present invention are possible. The present invention is defined by the appended claims.

We claim:

1. An electrical device, comprising:
a charge carrier transport layer formed using a ternary, or greater, semiconducting compound having a stoichiometry of 1:1:1 and an element combination selected from the set of I-III-IV, II-II-IV, and I-I-VI; or having a stoichiometry of 3:1:2 and an element combination selected from the set of I-III-V; or having a stoichiometry of 2:1:1 and an element combination selected from the set of I-II-V; or one of the compounds selected from the group of NaZnAs, CaCuN, CaCuP, NaZnSb, CuZnP, NaZnP, and NaZnN,
wherein the electrical device comprises a photovoltaic cell and the charge carrier transport layer comprises at least a radiation absorption layer of the photovoltaic cell, the charge carrier transport layer forming at least a p-side, or an n-side, or an intrinsic region of a p-n junction device or a p-i-n junction device, and
wherein the photovoltaic cell comprises p-type and n-type semiconductor compound layers grown in a chamber over a substrate, and
wherein the semiconductor compound is tuned by the selection of elements to have a band gap in the range of 0.8 eV to 2.37 eV.

2. The electrical device of claim 1, wherein the charge carrier transport layer forming the radiation absorption layer of the photovoltaic cell comprises a single p-n junction device or a multiple junction p-n junction device.

3. The electrical device of claim 1, wherein the semiconducting compound has a direct band gap in the range of 0.8 eV to 2.37 eV.

4. The electrical device of claim 1, wherein the semiconducting compound is selected from the group of NaZnAs, CaCuN, CaCuP, NaZnSb, CuZnP, NaZnP, and NaZnN.

5. The electrical device of claim 1, wherein the electrical device comprises a quantum well photovoltaic cell and the charge carrier transport layer comprises a quantum well layer or a barrier layer of a quantum well structure formed in the photovoltaic cell.

* * * * *